(12) United States Patent
Hatano et al.

(10) Patent No.: US 9,537,082 B2
(45) Date of Patent: Jan. 3, 2017

(54) PIEZOELECTRIC CERAMIC, PIEZOELECTRIC CERAMIC COMPONENT, AND PIEZOELECTRIC DEVICE USING SUCH PIEZOELECTRIC CERAMIC COMPONENT

(75) Inventors: Keiichi Hatano, Takasaki (JP); Hiroyuki Shimizu, Takasaki (JP); Yutaka Doshida, Takasaki (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 703 days.

(21) Appl. No.: 13/876,453

(22) PCT Filed: Dec. 13, 2011

(86) PCT No.: PCT/JP2011/078735
§ 371 (c)(1),
(2), (4) Date: Apr. 23, 2013

(87) PCT Pub. No.: WO2012/086449
PCT Pub. Date: Jun. 28, 2012

(65) Prior Publication Data
US 2013/0320815 A1    Dec. 5, 2013

(30) Foreign Application Priority Data

Dec. 24, 2010  (JP) .................................. 2010-288242

(51) Int. Cl.
*H01L 41/187*  (2006.01)
*C04B 35/00*  (2006.01)
(Continued)

(52) U.S. Cl.
CPC ......... *H01L 41/1873* (2013.01); *C04B 35/495* (2013.01); *H01H 57/00* (2013.01);
(Continued)

(58) Field of Classification Search
CPC .... H01L 41/187; H01L 41/18; H01L 41/0926; H01L 41/22; H01L 41/083; C04B 35/46; C04B 35/48; C04B 35/50; C04B 35/57; C04B 35/495; C04B 35/18; C04B 35/185; C04B 35/66; C04B 2235/3251; C04B 2235/3201; C04B 2235/3418; C04B 2235/3217
(Continued)

(56) References Cited

U.S. PATENT DOCUMENTS 6,387,295 B1    5/2002 Saito
2003/0178605 A1   9/2003 Nonoyama et al.
(Continued)

FOREIGN PATENT DOCUMENTS

JP    S56-030713 B2   7/1981
JP    2000-313664 A   11/2000
(Continued)

OTHER PUBLICATIONS

A Notice of Reasons for Refusal issued by Japanese Patent Office, mailed Jul. 14, 2014, for Japanese counterpart application No. 2012-549728.
(Continued)

*Primary Examiner* — Thomas Dougherty
(74) *Attorney, Agent, or Firm* — Law Office of Katsuhiro Arai (57) ABSTRACT

In a piezoelectric ceramic which has an alkali-containing niobate-based perovskite structure in which constituent elements are Li, Na, K, Nb, and O, a $Li_3NbO_4$ crystal phase is intentionally deposited on a piezoelectric ceramic having an alkali-containing niobate-based perovskite structure, whereby sintering becomes possible at about 1000° C. rather than at the normally required sintering temperature of 1050° C. or greater.

17 Claims, 4 Drawing Sheets

(51) Int. Cl.

| | | |
|---|---|---|
| *C04B 35/495* | (2006.01) | |
| *H03H 9/02* | (2006.01) | |
| *H01H 57/00* | (2006.01) | |
| *H01L 41/43* | (2013.01) | |
| *H01L 41/047* | (2006.01) | |

(52) U.S. Cl.
CPC ......... *H01L 41/0471* (2013.01); *H01L 41/43* (2013.01); *H03H 9/02031* (2013.01); *H03H 9/02543* (2013.01); *C04B 2235/3201* (2013.01); *C04B 2235/3203* (2013.01); *C04B 2235/3255* (2013.01); *C04B 2235/3291* (2013.01); *C04B 2235/5445* (2013.01); *C04B 2235/656* (2013.01); *C04B 2235/768* (2013.01); *C04B 2235/77* (2013.01); *C04B 2235/80* (2013.01)

(58) Field of Classification Search
USPC ............ 310/358, 366; 252/62.9 PZ, 62.9 R; 501/134
See application file for complete search history.

(56) References Cited

U.S. PATENT DOCUMENTS

| | | | |
|---|---|---|---|
| 2004/0058797 A1 | 3/2004 | Nonoyama et al. | |
| 2004/0127344 A1 | 7/2004 | Sato et al. | |
| 2008/0302996 A1* | 12/2008 | Yura et al. | 252/62.9 R |
| 2009/0023578 A1* | 1/2009 | Katayama | C01G 33/006 501/135 |
| 2009/0091214 A1* | 4/2009 | Ozawa | C04B 35/495 310/358 |
| 2009/0102325 A1* | 4/2009 | Ozawa | C01G 23/003 310/358 |
| 2012/0161588 A1 | 6/2012 | Hatano et al. | |
| 2012/0328878 A1* | 12/2012 | Karaki | C01G 33/006 428/402 |
| 2015/0132475 A1* | 5/2015 | Goh | H01L 41/0805 427/100 |

FOREIGN PATENT DOCUMENTS

| | | | |
|---|---|---|---|
| JP | 2002-068835 A | 3/2002 | |
| JP | 2003-342069 A | 12/2003 | |
| JP | 2004-115293 A | 4/2004 | |
| JP | 2004-244299 A | 9/2004 | |
| JP | 2004244299 * | 9/2004 | ........... C04B 35/495 |
| JP | 2004-300012 A | 10/2004 | |
| JP | 2008-169113 A | 7/2008 | |
| JP | 2008-207999 A | 9/2008 | |
| JP | 2009-114049 A | 5/2009 | |
| WO | 2010/128647 A | 11/2010 | |

OTHER PUBLICATIONS

Yasuyoshi Saito et al., Lead-free piezoceramics, Letters to Nature, Nov. 4, 2004, pp. 84-87, vol. 432.

Yiping Guo et al., Phase transitional behavior and piezoelectric properties of (Na0.5K0.5)NbO3—LiNbO3 ceramics, Applied Physics Letters, Nov. 1, 2004, pp. 4121-4123, vol. 85 No. 18, American Institute of Physics.

A Notification of First Office Action with Search Report issued by the State Intellectual Property Office of China, mailed Nov. 25, 2013, for Chinese counterpart application No. 201180044864.8.

* cited by examiner

Fig. 8 ary in which $Li_2CO_3$, $LiBO_2$ and $Li_2B_4O_7$ are mixed.
PIEZOELECTRIC CERAMIC, PIEZOELECTRIC CERAMIC COMPONENT, AND PIEZOELECTRIC DEVICE USING SUCH PIEZOELECTRIC CERAMIC COMPONENT This application is the U.S. National Phase under 35 U.S.C. §371 of International Application PCT/JP2011/078735, filed Dec. 13, 2011 which claims priority to Japanese Patent Application No. 2010-288242, filed Dec. 24, 2010. The International Application was published under PCT Article 21(2) in a language other than English.

TECHNICAL FIELD

The present invention relates to a piezoelectric ceramic of alkali-containing niobate-type perovskite structure, not containing heavy metal elements such as lead; a piezoelectric ceramic component using such piezoelectric ceramic, including a piezoelectric sound generator, piezoelectric sensor, piezoelectric actuator, piezoelectric transformer, and piezoelectric supersonic motor; and a piezoelectric device using such piezoelectric ceramic component.

BACKGROUND ART

Piezoelectric ceramics are a type of piezoelectric material that converts electrical energy to mechanical energy, and mechanical energy to electrical energy, and they are applied in many electronic devices. Among such piezoelectric ceramics, binary Pb-containing piezoelectric ceramics constituted by the two constituents of $PbTiO_3$ and $PbZrO_3$ (hereinafter referred to as "PZT") and tertiary Pb-containing piezoelectric ceramics containing $Pb(Mg_{1/3}Nb_{2/3})O_3$ or $Pb(Zn_{1/3}Nb_{2/3})O_3$ as the third constituent, are known. Such PZT provides high piezoelectric effect and is widely used as piezoelectric ceramic components. However, piezoelectric ceramics whose main constituent is PZT present problems in that they have high environmental burdens in the form of volatilization of PbO in the production process, flow-out of Pb constituent due to exposure to acid rain, and the like.

Accordingly, non-Pb piezoelectric ceramics containing no lead are pursued. As disclosed examples of Pb-free piezoelectric ceramics, Nature, 432 (4), 2004, pp. 84-87 (Non-patent Literature 1) and Applied Physics Letters 85 (18), 2004, pp. 4121-41232 (Non-patent Literature 2) disclose piezoelectric ceramics providing piezoelectric effect equivalent to PZT, having an alkali-containing niobate perovskite structure.

Such piezoelectric ceramics having an alkali-containing niobate perovskite structure are also disclosed in Japanese Patent Laid-open No. 2002-068835 (Patent Literature 1), Japanese Patent Laid-open No. 2003-342069 (Patent Literature 2), and Japanese Patent Laid-open No. 2004-300012 (Patent Literature 3). The piezoelectric ceramics in Patent Literatures 2 and 3 have Li, Na, K, Nb, Ta, Sb and O as main constituents, are expressed by the general formula $\{Li_x[Na_{1-y}K_y]_{1-x}\}_a\{Nb_{1-z-w}Ta_zSb_w\}_bO_3$ (in the formula, x, y, z, w, a and b indicate mol ratios, where $0 \leq x \leq 0.2$, $0 \leq y \leq 1$, $0 \leq z \leq 0.4$, $0 \leq w \leq 0.2$, $a \leq 0.95$, and $b \leq 1.05$), and have high piezoelectric characteristics (piezoelectric constant, electro-mechanical coupling coefficient, etc.). Also, as disclosed in Japanese Patent Laid-open No. 2008-169113 (Patent Literature 4), adding 0.001 mol to 0.15 mol of Ag as an additive element to 1 mol of chemical compound whose main constituent is expressed by the above general formula will improve at least one of the characteristics that include the piezoelectric constant, electro-mechanical coupling coefficient, specific dielectric constant, dielectric loss, and Curie temperature.

Among the piezoelectric ceramics expressed by the above general formula, however, antimony (Sb) belongs to the heavy metal class and presents concerns over toxicity to the human body. Accordingly, piezoelectric ceramics not containing antimony are desired. Also, while tantalum (Ta) can lower the Curie temperature, raise the dielectric constant of piezoelectric ceramics, and enhance the piezoelectric constant and other characteristics, use of tantalum raises the sintering temperature needed to obtain dense ceramics.

As explained above, piezoelectric ceramics having an alkali-containing niobate perovskite structure, not containing Sb or Ta and having Li, Na, K, Nb and O as constituent elements (hereinafter referred to as "LNKN"), offer excellent piezoelectric characteristics, but the sintering property is poorer than Pb-containing piezoelectric ceramics. For example, $Li_{0.06}Na_{0.47}K_{0.47}NbO_3$, which is a type of LNKN, exhibits excellent characteristics as evident from displacement characteristics $d_{33}$ in the polarization axis direction of 235 pC/N, but it must be sintered at temperatures of 1050° C. to 1100° C. in order to obtain a dense sintered compact, as disclosed in Non-patent Literature 2. Sintering at high temperatures causes alkali metal elements to evaporate easily and piezoelectric effect may deteriorate. Accordingly, sintering temperatures must be controlled precisely in order to obtain ceramics having sufficiently high piezoelectric effect.

Japanese Patent Laid-open No. 2008-207999 (Patent Literature 5) discloses a technology to obtain a dense sintered compact at low sintering temperatures by using a sintering auxiliHowever, $Li_2CO_3$ remains in the sintered compact as $Li_2O$ after sintering, which causes the resistance of ceramics to drop. Additionally, $LiBO_2$ and $Li_2B_4O_7$ can cause piezoelectric characteristics to drop.

Furthermore, Japanese Patent Laid-open No. 2004-115293 (Patent Literature 6) discloses a piezoelectric ceramic whose sintering property has been improved by adjusting the composition of the starting material to contain excessive elements (Nb, Ta) at the B site of (K,Na)(Nb,Ta)$O_3$ beyond the stoichiometric ratio, and also by adding CuO. However, this piezoelectric ceramic also requires sintering temperatures of 1050° C. or above in order to obtain a dense sintered compact.

BACKGROUND ART LITERATURE

Patent Literature

Patent Literature 1: Japanese Patent Laid-open No. 2002-068835
Patent Literature 2: Japanese Patent Laid-open No. 2003-342069
Patent Literature 3: Japanese Patent Laid-open No. 2004-300012
Patent Literature 4: Japanese Patent Laid-open No. 2008-169113
Patent Literature 5: Japanese Patent Laid-open No. 2008-207999
Patent Literature 6: Japanese Patent Laid-open No. 2004-115293

Non-Patent Literature

Non-patent Literature 1: Nature, 432 (4), 2004, pp. 84-87
Non-patent Literature 2: Applied Physics Letters 85 (18), 2004, pp. 4121-4123

SUMMARY OF THE INVENTION

Problems to be Solved by the Invention

As mentioned above, sintering temperatures of 1050° C. to 1100° C. are needed to obtain a dense sintered compact of LNKN, and therefore LNKN is not an appropriate alternative to Pb-containing piezoelectric ceramics providing a dense sintered compact at around 1000° C. and offering high piezoelectric characteristics. To use LNKN as a piezoelectric ceramic for a laminated piezoelectric ceramic component having precious-metal or base-metal electrodes, for example, desirably a sintering temperature of approx. 1000° C. is used to suppress contraction of internal electrodes. However, no technology is known to date by which a dense sintered compact of LNKN can be obtained at approx. 1000° C.

The object of various embodiments of the present invention is to provide a ceramic compound whose main constituent is LNKN, which can be sintered at around 1000° C. without compromising piezoelectric characteristics.

Means for Solving the Problems

The inventors of the present invention found that, by depositing the $Li_3NbO_4$ crystal phase on a piezoelectric ceramic having an alkali-containing niobate perovskite structure and Li, Na, K, Nb and O as constituent elements, the piezoelectric ceramic could be densely sintered at around 1000° C.

A piezoelectric ceramic in an embodiment of the present invention has an alkali-containing niobate perovskite structure and Li, Na, K, Nb and O as constituent elements, wherein such ceramic holds a crystal phase expressed by the composition formula $Li_3NbO_4$.

Effects of the Invention

Embodiments of the present invention provide a ceramic compound whose main constituent is LNKN, which can be sintered at around 1000° C. without compromising piezoelectric characteristics.

MODE FOR CARRYING OUT THE INVENTION

The present application for patent claims priority based on Japanese Patent Application No. 2010-288242. The content of this application is incorporated into this Specification in its entirety by reference.

Figure 1:
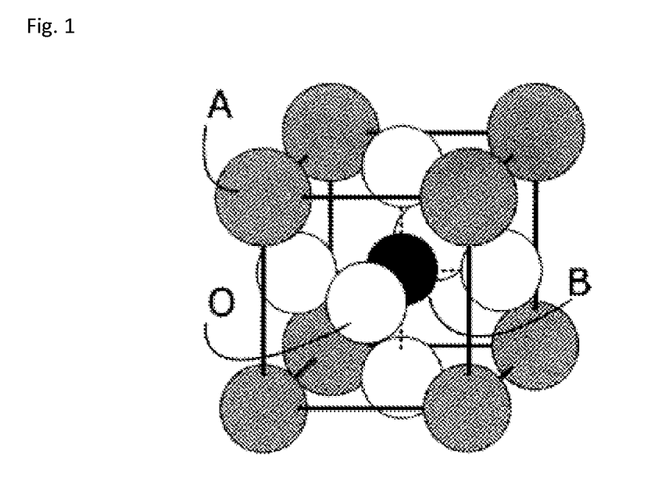
FIG. 1 is a schematic drawing showing the crystal structure of an $ABO_3$ type perovskite structure.
Figure 2:
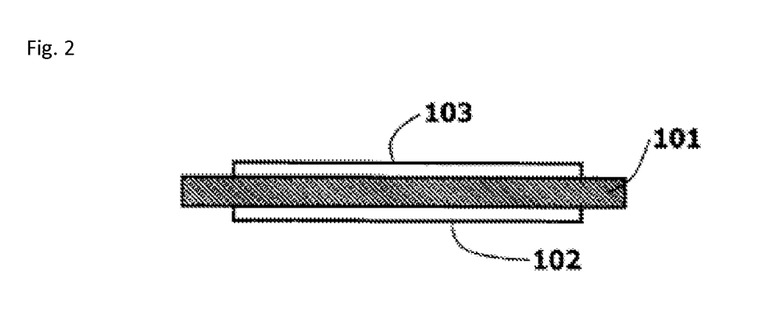
FIG. 2 is a side view showing an example of a piezoelectric device conforming to the present invention.

Piezoelectric ceramic materials in various embodiments of the present invention are mainly constituted by a piezoelectric ceramic having an alkali-containing niobate perovskite structure and Li, Na, K, Nb and O as constituent elements (i.e., LNKN). The alkali-containing niobate perovskite structure is a type of $ABO_3$-type perovskite structure, where the A site has K, Na, Li or other alkali metal element, while the B site has Nb. FIG. 1 shows a schematic drawing of the perovskite structure. As illustrated, the perovskite structure has a unit structure where six O's are positioned around the B site and 12 O's are positioned around the A site, and crystal is formed by a cyclical succession of these unit structures. With the perovskite structure, all site positions are occupied by the corresponding elements and a stable structure is obtained when the composition ratio (mol ratio) of the element occupying the A site and element occupying the B site becomes 1:1 according to the stoichiometric ratio of the perovskite structure. However, the composition of the sintered compact of LNKN may vary by a maximum of 2% or so from the composition according to the stoichiometric ratio due to elution of K, Na and Li, volatilization of K, Na and Li in the tentative sintering process or sintering process, and so on. How much these constituent elements vary changes depending on the material, timing of synthesis, and synthesis process.

Accordingly, in the initial compounding, the compounding ratio of the material for the element occupying the A site (K, Na or Li) to the material for the element occupying the B site is increased above the ideal compounding ratio specified by the stoichiometric ratio, so that the composition ratio of the element occupying the A site and element occupying the B site will become the stoichiometric ratio of 1:1 in the finally obtained sintered compact. For the finally obtained LNKN to have high piezoelectric effect, however, desirably the composition ratio of the element contained at the A site and element contained at the B site after sintering is in the range of $0.98 < A/B < 1.01$. If the compounding ratio of the material for the K, Na or Li element occupying the A site is increased, however, $K_2O$, $Na_2O$, $Li_2O$ or other oxide or $K_2CO_3$, $Na_2CO_3$, $Li_2CO_3$ or other carbonate compound may deposit, which may lower the specific resistivity of the obtained piezoelectric ceramic or cause deliquescence.

In an embodiment of the present invention, a piezoelectric ceramic having high sintering property can be obtained by depositing $Li_3NbO_4$ on the main constituent of LNKN. In an embodiment, $Li_3NbO_4$ can be deposited on the main constituent of LNKN by compounding the material for Li such as $Li_2CO_3$, etc., in such a way that Li becomes excessive beyond the stoichiometric ratio of LNKN. In an embodiment, a commercial $Li_2CO_3$ product is pre-crushed for 24 hours in a ball mill to an average particle size of 1 μm or less and the obtained $Li_2CO_3$ can be used as the starting material. Many commercial $Li_2CO_3$ products have an average particle size of 5 μm or more and when such $Li_2CO_3$ with an average particle size of 5 μm or more is used, deposition of $Li_3NbO_4$ becomes difficult. With the piezoelectric ceramic pertaining to an embodiment of the present invention, $Li_3NbO_4$ is deposited on the main constituent of LNKN to allow for easy sintering at around 1000° C. and obtain a piezoelectric ceramic whose piezoelectric characteristics are less compromised than a piezoelectric ceramic not containing the $Li_3NbO_4$ crystal phase. With the piezoelectric ceramic pertaining to an embodiment of the present invention, the $Li_3NbO_4$ crystal phase containing an excessive alkali constituent compared to the main constituent of the perovskite structure that contains the alkali constituent and niobium at a ratio of 1:1, is deposited on the main constituent, and this probably allows the alkali constituent that volatilizes from the perovskite structure during sintering to be supplemented with surplus Li, to compensate for sintering property.

In an embodiment, the $Li_3NbO_4$ crystal phase may be the cubic crystal phase described under PDF-01-082-1198 or PDF-01-075-0902 in ICSD (Inorganic Crystal Structure Database). In an embodiment, the lattice constant of the $Li_3NbO_4$ crystal phase is 8.412 Å or 8.429 Å. Here, the lattice constants and their respective diffraction line intensity ratios are affected by the crystallization property of the $Li_3NbO_4$ crystal phase, defect factors in the crystal structure, etc., and the lattice constant may change at the second decimal place and below, for example. However, this does not pose an impediment to the present invention.

A piezoelectric ceramic pertaining to an embodiment of the present invention may be expressed by the composition formula $\{Li_x[Na_yK_{1-y}]_{1-x}\}_aNbO_3$ (in the formula, $0.0<x\leq0.20$, $0\leq y\leq1$, and $1.0\leq a\leq1.01$). A piezoelectric ceramic in an embodiment is expressed by the composition formula $\{Li_x[Na_yK_{1-y}]_{1-x}\}_aNbO_3$ (in the formula, $0.03\leq x\leq0.10$, $0.40\leq y\leq0.60$, and $1.0\leq a\leq1.01$). By adjusting the composition ratio of the constituent elements of a piezoelectric ceramic pertaining to an embodiment of the present invention, to the ranges specified by these composition formulas, piezoelectric characteristics equivalent to those of Pb-containing piezoelectric ceramics can be obtained, and dense sintering becomes possible at around 1000° C. As a result, a Pb-free piezoelectric ceramic that can substitute a Pb-containing piezoelectric ceramic used for piezoelectric devices can be provided.

A piezoelectric ceramic pertaining to an embodiment of the present invention may contain Ag by 0.1 mol or more to 0.5 mol in equivalent $Ag_2O$, relative to 100 mol of the main constituent of LNKN expressed by $\{Li_x[Na_yK_{1-y}]_{1-x}\}_aNbO_3$. This way, deposition of the $Li_3NbO_4$ crystal phase can be promoted further and sintering can be performed easily without compromising piezoelectric characteristics. In an embodiment, Ag is contained by 0.1 mol or more to 0.25 mol or less in equivalent $Ag_2O$ relative to 100 mol of the main constituent. This way, drop in specific resistivity caused by an increase in Ag content can be suppressed. When $Ag_2O$ is added, a $(Li,Ag)_3NbO_4$ crystal phase, resulting from partial substitution of Li by Ag in the $Li_3NbO_4$ crystal phase, is deposited, but the obtained effect is the same as when only the $Li_3NbO_4$ crystal phase is deposited. This is because the $Li_3NbO_4$ crystal phase and $(Li,Ag)_3NbO_4$ crystal phase have the same symmetry that determines the crystal system, lattice constant, and other crystal properties.

Patent Literature 4 discloses adding Ag to the main constituent containing Ta and Sb, but a piezoelectric ceramic pertaining to an embodiment of the present invention is distinguished from the piezoelectric ceramic in Patent Literature 4 in that it does not contain Ta or Sb.

A piezoelectric ceramic in an embodiment of the present invention contains at least one type of first transition element from among Sc, Ti, V, Cr, Mn, Fe, Co, Ni, Cu and Zn. This makes it possible to control the sintering temperature, control the growth of particles, and control the dielectric breakdown in a high electric field.

A piezoelectric ceramic in an embodiment of the present invention contains at least one type of second transition element from among Y, Zr, Mo, Ru, Rh and Pd. This makes it possible to control the sintering temperature, control the growth of particles, and control the dielectric breakdown in a high electric field.

A piezoelectric ceramic in an embodiment of the present invention contains at least one type of third transition element from among La, Ce, Pr, Nd, Sm, Eu, Gd, Tb, Dy, Ho, Er, Tm, Yb, Lu, Hf, W, Re, Os, Ir, Pt and Au. This makes it possible to control the sintering temperature, control the growth of particles, and control the dielectric breakdown in a high electric field.

A piezoelectric ceramic in an embodiment of the present invention contains elements selected from the first transition elements and second transition elements, elements selected from the first transition elements and third transition elements, elements selected from the second transition elements and third transition elements, or elements selected from the first transition elements, second transition elements and third transition elements.

Next, piezoelectric ceramic components using a piezoelectric ceramic pertaining to an embodiment of the present invention, as well as piezoelectric devices using such piezoelectric ceramic components, are explained by referring to FIGS. 2 to 5. The piezoelectric ceramic component in FIG. 2 has a sheet-shaped piezoelectric ceramic layer 101, first electrode 102, and second electrode 103. The first electrode 102 and second electrode 103 are placed in a manner facing each other via the piezoelectric ceramic layer 101. The piezoelectric ceramic layer 101 is made of a piezoelectric ceramic pertaining to an embodiment of the present invention, and specifically it is made of LNKN from which the crystal phase expressed by the composition formula $Li_3NbO_4$ is deposited. In an embodiment, the piezoelectric ceramic layer 101 is prepared by mixing a material mixture powder of a piezoelectric ceramic with a binder and then forming the mixture into a sheet-shaped molding and sintering the molding. Next, a conductive paste using Cu, Ag, Au, Pt or other conductor is applied on both sides of this piezoelectric ceramic layer 101 and this conductive paste is baked to form the first electrode 102 and second electrode 103. The piezoelectric ceramic layer 101 is densely sintered at around 1000° C., so it offers excellent mass-producibility compared to when the conventional LNKN not containing $Li_3NbO_4$ crystal phase is used.

Figure 3:
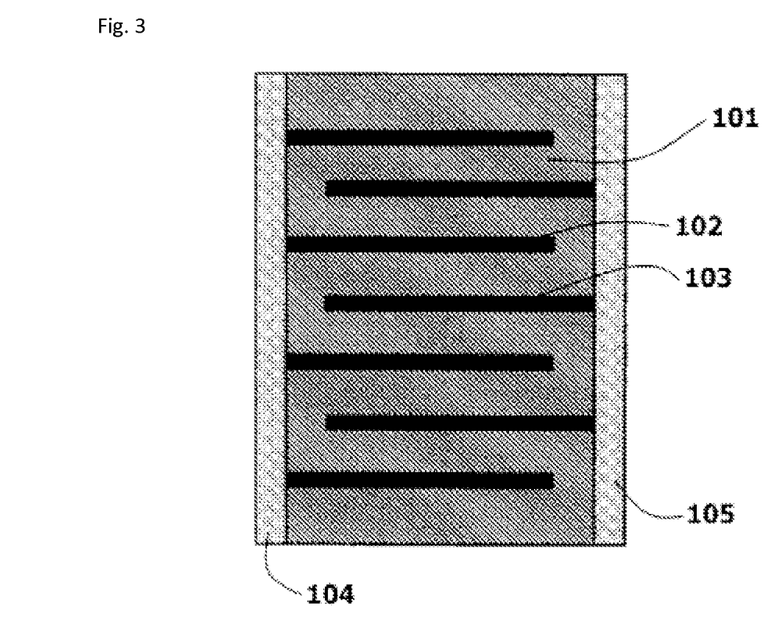
FIG. 3 is a schematic section view showing an example of a piezoelectric device conforming to the present invention.

FIG. 3 is a schematic section view of a laminated piezoelectric ceramic component pertaining to an embodiment of the present invention. As illustrated, the laminated piezoelectric ceramic component pertaining to an embodiment of the present invention includes a piezoelectric ceramic layer 101, multiple first electrodes 102, multiple second electrodes 103, a first terminal electrode 104 electrically connected to each of the first electrodes 102, and a second terminal electrode 105 electrically connected to each of the second electrodes 103. Each of the first electrodes 102 is positioned in a manner facing the adjacent second electrode 103 via the piezoelectric ceramic layer 101. This laminated piezoelectric ceramic component is used as a laminated piezoelectric actuator, for example. Since this piezoelectric ceramic layer 101 can be densely sintered at around 1000° C., the laminated piezoelectric ceramic component pertaining to an embodiment of the present invention offers excellent mass-producibility compared to components of the same type using the conventional LNKN not containing $Li_3NbO_4$ crystal phase.

Figure 4:
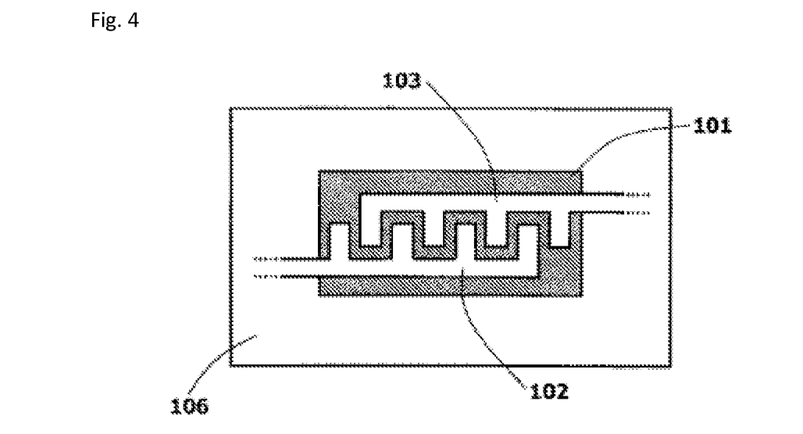
FIG. 4 is a plan view showing an example of a piezoelectric device conforming to the present invention.

FIG. 4 shows a schematic drawing of a piezoelectric surface acoustic wave (SAW) filter pertaining to an embodiment of the present invention. As illustrated, the piezoelectric surface acoustic wave filter pertaining to an embodiment of the present invention has a substrate 106, a piezoelectric ceramic layer 101 formed on the substrate 106, and a first electrode 102 and second electrode 103 placed in a manner facing each other and roughly flush with the piezoelectric ceramic layer 101 on the substrate 106. Since the piezoelectric ceramic layer 101 can be densely sintered at around 1000° C., the piezoelectric surface acoustic wave filter pertaining to an embodiment of the present invention offers excellent mass-producibility compared to filters of the same type using the conventional LNKN not containing $Li_3NbO_4$ crystal phase.

Figure 5:
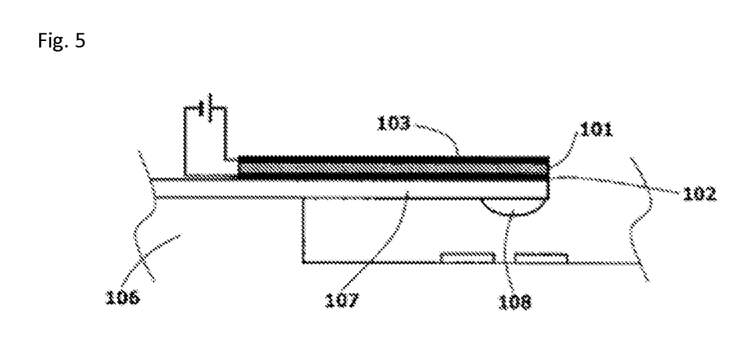
FIG. 5 is a schematic section view showing an example of a piezoelectric device conforming to the present invention.

FIG. 5 shows a schematic section view of a switching element using a flex-type piezoelectric actuator pertaining to an embodiment of the present invention. As illustrated, the switching element pertaining to an embodiment of the present invention has a substrate 106, a first electrode 102 formed on the substrate 106, a piezoelectric ceramic layer 101 formed on the first electrode 102, a second electrode 103 formed on the piezoelectric ceramic layer 101, an elastic body 107, and a contact 108. Since the piezoelectric ceramic layer 101 can be densely sintered at around 1000° C., the switching element using a flex-type piezoelectric actuator pertaining to an embodiment of the present invention offers excellent mass-producibility compared to switching elements of the same type using the conventional LNKN not containing $Li_3NbO_4$ crystal phase.

EXAMPLE

An example of the present invention is explained below, but it should be noted that the present invention is not limited to this example in any way. First, $Li_2CO_3$, $Na_2CO_3$ (or $NaHCO_3$), $K_2CO_3$ (or $KHCO_3$), and $Nb_2O_5$ of 99% or higher in purity were prepared as the starting materials for the main constituent LNKN, and weighed to the stoichiometric ratios of x=0.066, y=0.557 and a=1.0 in the composition formula $\{Li_x[Na_{1-y}K_y]_{1-x}\}_aNbO_3$ (in the formula, $0.0 \le x \le 0.20$, $0 \le y \le 1$, and $1.0 \le a \le 1.01$). For the starting material $Li_2CO_3$, a commercial $Li_2CO_3$ product that had been pre-crushed for 24 hours in a ball mill and adjusted to an average particle size of 1 m or less was used. Also for the starting material for depositing the $Li_3NbO_4$ crystal phase, 0.2 mol of $Li_2CO_3$ was weighed relative to 100 mol of the main constituent LNKN. Next, the weighed materials for the main constituent, and material for depositing the $Li_3NbO_4$ crystal phase, were wet-mixed for approx. 24 hours in a ball mill to obtain a mixture. Next, this mixture was dried in an ambience of approx. 100° C., and then tentatively sintered at 700° C. to 1000° C. to obtain a tentatively sintered powder. Next, this tentatively sintered powder was wet-crushed for approx. 24 hours in a ball mill, and then dried in an ambience of approx. 100° C. to obtain a crushed powder. Thereafter, $Ag_2O$ was added by 0.1 mol, 0.25 mol, 0.50 mol and 1.00 mol to the obtained crushed powder, relative to 100 mol of the main constituent LNKN, and each mixture was wet-mixed in a ball mill for approx. 24 hours, to check the effect from containing Ag. Next, each of these mixtures was dried in an ambience of approx. 100° C. to obtain four types of $Ag_2O$-mixed crushed powders, each with a different $Ag_2O$ content. Next, an organic binder was added to and mixed with each of these $Ag_2O$-mixed crushed powders, and each mixture was passed through a 60-mesh sieve to adjust the granularity. Next, each of these granularity-adjusted mixtures was molded using a single-axis molder at a pressure of 1000 kg/cm², to obtain a disk-shaped molding of 10 mm in diameter and 0.5 mm in thickness. Next, each of these moldings was sintered in air at temperatures of 960° C. to 1100° C., to obtain four types of sintered compacts of piezoelectric ceramic, each with a different Ag content (corresponding to Sample Nos. 3 to 6 in Table 1).

Additionally, in the process of preparing these piezoelectric ceramics corresponding to Sample Nos. 3 to 6, only the $Ag_2O$ mixing step was skipped to prepare a piezoelectric ceramic not containing $Ag_2O$ (corresponding to Sample No. 2 in Table 1). Also, in the process of preparing this piezoelectric ceramic corresponding to Sample No. 2, the step to mix $Li_2CO_3$ for depositing the $Li_3NbO_4$ crystal phase was skipped to prepare a piezoelectric ceramic not containing excessive $Li_2CO_3$ for depositing the $Li_3NbO_4$ crystal phase (but containing $Li_2CO_3$ as the material for the main constituent LNKN) (corresponding to Sample No. 1 in Table 1).

Next, a silver paste was applied on both surfaces of each of the six types of piezoelectric ceramic obtained as mentioned above, and this silver paste was baked at 850° C. to form silver electrodes. Next, approx. 3 to 4 kV/mm of electric field equal to or above the coercive electric field was applied, in the form of DC voltage, for 15 minutes in insulating oil to each of these piezoelectric ceramics on which silver electrodes were formed, to implement polarization. Thereafter, each sample was kept stationary overnight, to obtain Sample Nos. 1 to 6 of piezoelectric ceramics. The compositions of thus prepared Sample Nos. 1 to 6 of piezoelectric ceramics are shown in Table 1.

TABLE 1

| Sample No. | x | y | Amount of excessive $Li_2CO_3$ (mol %) | $Ag_2O$ content (mol %) |
|---|---|---|---|---|
| ✗1 | 0.066 | 0.557 | 0 | 0 |
| 2 | 0.066 | 0.557 | 0.2 | 0 |
| 3 | 0.066 | 0.557 | 0.2 | 0.1 |
| 4 | 0.066 | 0.557 | 0.2 | 0.25 |
| 5 | 0.066 | 0.557 | 0.2 | 0.50 |
| ✗6 | 0.066 | 0.557 | 0.2 | 1.00 |

Among the samples shown in Table 1, those denoted by ✗ are outside the scope of the present invention.

Figure 6:
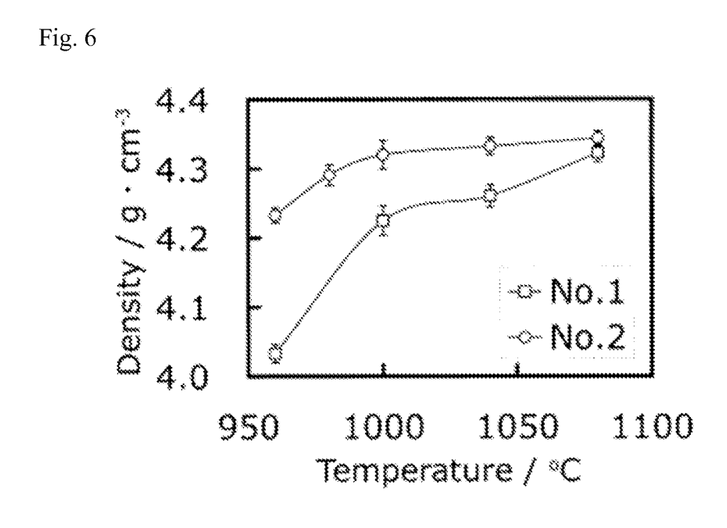
FIG. 6 is a graph showing the dependence of sintering density on sintering temperature for each of Sample No. 1 and Sample No. 2.

Next, a piezoelectric ceramic having the same composition as Sample No. 1 representing a comparative example, and the same composition as Sample No. 2 representing an example of the present invention, were prepared at multiple sintering temperatures and the sintered compact prepared at each sintering temperature was measured for sintering density. FIG. 6 is a graph showing the measured dependence of sintering density on sintering temperature. As is evident from FIG. 6, the piezoelectric ceramic having the same composition as Sample No. 1 could not be densely sintered unless the sintering temperature was raised to 1080° C., but the piezoelectric ceramic having the same composition as Sample No. 2 to which excessive $Li_2CO_3$ was added was such that its sintering accelerated at around 1000° C. and sintering density became higher. Both samples melted partially when sintered at temperatures of 1080° C. and above. Accordingly, it was concluded that a uniform sintered compact could not be obtained at 1080° C. or above.

Next, whether or not Sample Nos. 1 to 6 in Table 1 contained the $Li_3NbO_4$ crystal phase was checked in the following manner. First, each sample that had been stripped of electrodes was crushed for 30 minutes in ethanol using an agate mortar. Each of the crushed samples was measured for XRD using the X-ray diffraction method. This measurement was performed according to the concentration method using the RINT-2500PC X-ray diffractometer by Rigaku. Cu-Kα line was used as the line source, while the applied voltage was 50 kV and applied current was 100 mA. The 2θ/θ method was used to take a measurement every second at a pitch of 0.02° according to the fixed time method in the range of $10° \leq 2\theta \leq 60°$.

Figure 7:
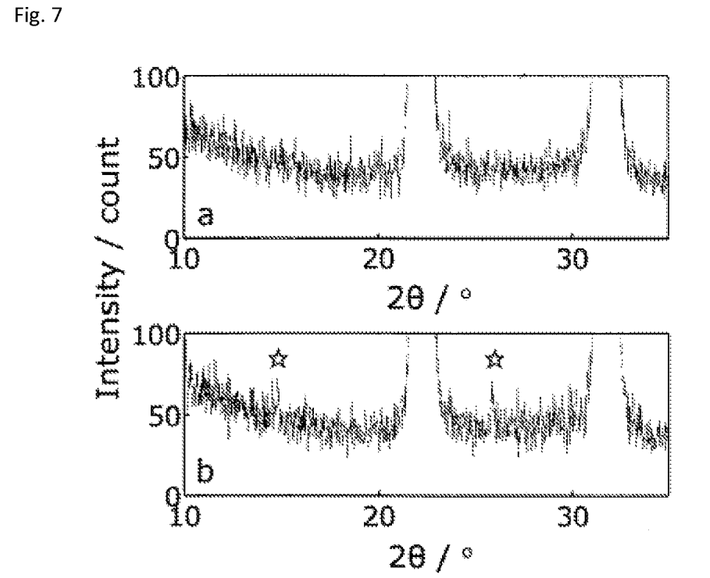
FIG. 7 is graphs showing X-ray diffraction profiles of Sample No. 1 (top) and Sample No. 2 (bottom).

The top graph in FIG. 7 shows the X-ray diffraction profile of Sample No. 1 measured as above, while the bottom graph in FIG. 7 shows the X-ray diffraction profile of Sample No. 2. FIG. 7 shows enlarged near-background peaks in the diffraction profiles of $10° \leq 2\theta \leq 35°$. As is evident from FIG. 7, the profile of Sample No. 2 has peaks of $Li_3NbO_4$ crystal phase as indicated by ☆ (star).

Figure 8:
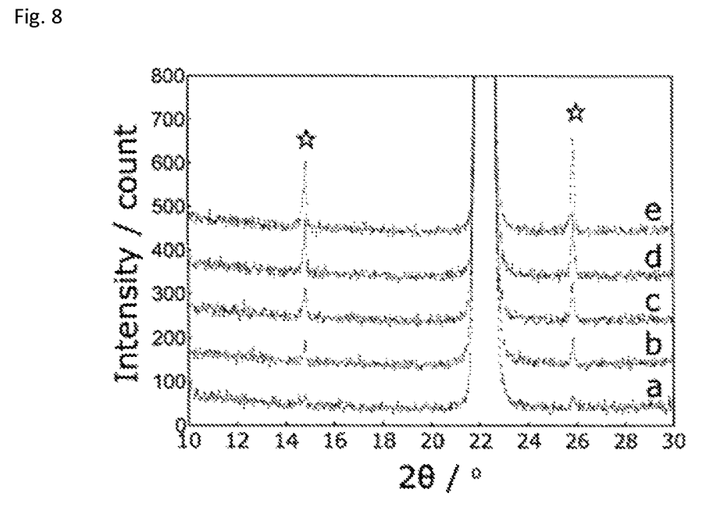
FIG. 8 is a graph showing X-ray diffraction profiles of Sample Nos. 2 to 6.

FIG. 8 shows the X-ray diffraction profiles of Sample Nos. 2 to 6. The graph line of reference symbol a in FIG. 8 represents the profile of Sample No. 2, graph line of reference symbol b represents the profile of Sample No. 3, graph line of reference symbol c represents the profile of Sample No. 4, graph line of reference symbol d represents the profile of Sample No. 5, and graph line of reference symbol e represents the profile of Sample No. 6. As illustrated, piezoelectric ceramics containing $Ag_2O$ deposited more $Li_3NbO_4$ crystal phase as the $Ag_2O$ content increased. In other words, the $Li_3NbO_4$ crystal phase can be deposited on the main phase LNKN when $Ag_2O$ is contained.

Next, Sample Nos. 1 to 6 were each measured for the electrical characteristics shown in Table 2 using the resonance-antiresonance method according to the JEITA EM-4501 standard set by the Japan Electronics and Information Technology Industries Association. This measurement was performed using an impedance analyzer (YHP4194A manufactured by Yokogawa-Hewlett-Packard). Also, a $d_{33}$ meter (ZJ-6B manufactured by the Institute of Acoustics, Chinese Academy of Science) was used to evaluate piezoelectric characteristics in terms of piezoelectric constant $d_{33}$. Each coefficient was measured on samples of Sample Nos. 1 and 2 sintered at 1000° C. and 1080° C., while each coefficient was measured on samples of Sample Nos. 3 to 6 sintered at 1000° C. Here, $\epsilon_{33}^T/\epsilon_0$ represents the specific dielectric constant after polarization, measured in the direction in which electric field was applied during the polarization; kp represents the electro-mechanical coupling coefficient measured in the diameter direction of disk-shaped piezoelectric ceramics after polarization; $Y_{11}^E$ represents the Young's modulus measured in the direction vertical to the direction in which electric field was applied during the polarization; $d_{31}$ represents the piezoelectric constant measured in the direction vertical to the direction in which electric field was applied during the polarization; and $d_{33}$ represents the piezoelectric constant measured in parallel with the direction in which electric field was applied during the polarization.

TABLE 2

| Sample No. | Sintering temperature | $\epsilon_{33}^T/\epsilon_0$ | kp (%) | $Y_{11}^E$ ($\times 10^{10}$ N/m²) | $d_{31}$ (pC/N) | $d_{33}$ (pC/N) |
|---|---|---|---|---|---|---|
| ✗1 | 1000° C. | | Could not be polarized. | | | |
| | 1080° C. | 960 | 41 | 8.3 | −71 | 185 |
| 2 | 1000° C. | 960 | 42 | 8.1 | −81 | 190 |
| | 1080° C. | 920 | 41 | 8.5 | −72 | 180 |
| 3 | 1000° C. | 990 | 41 | 7.9 | −80 | 195 |
| 4 | 1000° C. | 945 | 40 | 7.5 | −79 | 205 |
| 5 | 1000° C. | 465 | 39 | 9.1 | −50 | 150 |
| ✗6 | 1000° C. | 405 | 31 | 9.2 | −39 | 110 |

The sample of Sample No. 1 sintered at 1000° C. had low resistivity and underwent dielectric breakdown during the polarization, and therefore its piezoelectric characteristics could not be evaluated. As for Sample No. 2, both the sample sintered at 1000° C. and sample sintered at 1080° C. could be polarized. Also, even the sample sintered at 1000° C. had high piezoelectric characteristics comparable to the sample of Sample No. 1 sintered at 1080° C. This confirmed that, with respect to Sample No. 2 representing an example of the present invention, a dense sintered compact was obtained at around 1000° C. by compounding excessive $Li_2CO_3$ beyond the stoichiometric ratio of LNKN and thereby depositing the $Li_3NbO_4$ crystal phase, and that the resulting piezoelectric characteristics were not compromised in any way compared to when the stoichiometric ratio of LNKN was followed in the compounding (Sample 1).

Similarly with Sample Nos. 3 to 6, a sufficiently dense sintered compact was obtained when sintered at 1000° C. Among others, Sample Nos. 3 and 4 had a lower Young's modulus although the electro-mechanical coupling coefficient was not affected, and therefore these piezoelectric ceramics were more prone to deformation. This resulted in an improvement of $d_{33}$. Also with Sample No. 5, the electro-mechanical coupling coefficient was not affected. As for Sample No. 6, both the specific dielectric constant and electro-mechanical coupling coefficient dropped significantly and the Young's modulus rose, and consequently both the piezoelectric constants $d_{31}$ and $d_{33}$ dropped significantly.

Based on the above results, it is clear that the $Ag_2O$ content in $Ag_2O$-containing piezoelectric ceramics is preferably 0.1 mol or more and 0.5 mol or less in equivalent $Ag_2O$ relative to 100 mol of the main constituent LNKN. In addition, testing of the effects of the present invention according to the same procedure on piezoelectric ceramics expressed by the composition formula $\{Li_x[Na_{1-y}K_y]_{1-x}\}_a NbO_3$ (in the formula, $0.0 < x \leq 0.20$, $0 \leq y \leq 1$, and $1.0 \leq a \leq 1.01$), other than those shown in the above example, confirmed similar effects.

DESCRIPTION OF THE SYMBOLS

101: Piezoelectric ceramic layer
102: First electrode
103: Second electrode
104: First terminal electrode
105: Second terminal electrode
106: Substrate
107: Elastic body
108: Contact

What is claimed is:

1. A piezoelectric ceramic having an alkali-containing niobate perovskite structure and Li, Na, K, Nb and O as constituent elements, and holding a crystal phase expressed by a composition formula $Li_3NbO_4$, wherein the piezoelectric ceramic shows peaks of $Li_3NbO_4$ crystal phase in an X-ray diffraction profile and is expressed by a composition formula $\{Li_x[Na_yK_{1-y}]_{1-x}\}_a NbO_3$ (in the formula, $0 < x \leq 0.20$, $0 \leq y \leq 1$, and $1.0 \leq a \leq 1.01$) containing no Sb nor Ta.

2. A piezoelectric ceramic according to claim 1, which contains Ag by 0.1 mol or more and 0.5 mol or less in equivalent Ag$_2$O relative to 100 mol of the piezoelectric ceramic.

3. A piezoelectric ceramic component having a first electrode and a second electrode facing each other via a piezoelectric ceramic layer, wherein the piezoelectric ceramic layer is formed by a piezoelectric ceramic according to claim 1.

4. A piezoelectric ceramic component having multiple first electrodes and multiple second electrodes alternately layered via piezoelectric ceramic layers, as well as a first terminal electrode that electrically connects to the first electrodes and a second terminal electrode that electrically connects to the second electrodes, wherein the piezoelectric ceramic layer is formed by a piezoelectric ceramic according to claim 1.

5. A piezoelectric ceramic component having a substrate with a piezoelectric ceramic layer, as well as a first electrode and a second electrode placed on top of the piezoelectric ceramic layer in a manner facing each other, wherein the piezoelectric ceramic layer is formed by a piezoelectric ceramic according to claim 1.

6. A piezoelectric ceramic component having multiple first electrodes and multiple second electrodes layered alternately on a substrate with piezoelectric ceramic layers, as well as a first terminal electrode that electrically connects to the first electrodes and a second terminal electrode that electrically connects to the second electrodes, wherein the piezoelectric ceramic layer is formed by a piezoelectric ceramic according to claim 1.

7. A piezoelectric device comprising a piezoelectric ceramic component according to claim 3.

8. A piezoelectric ceramic component having a first electrode and a second electrode facing each other via a piezoelectric ceramic layer, wherein the piezoelectric ceramic layer is formed by a piezoelectric ceramic according to claim 2.

9. A piezoelectric ceramic component having multiple first electrodes and multiple second electrodes alternately layered via piezoelectric ceramic layers, as well as a first terminal electrode that electrically connects to the first electrodes and a second terminal electrode that electrically connects to the second electrodes, wherein the piezoelectric ceramic layer is formed by a piezoelectric ceramic according to claim 2.

10. A piezoelectric ceramic component having a substrate with a piezoelectric ceramic layer, as well as a first electrode and a second electrode placed on top of the piezoelectric ceramic layer in a manner facing each other, wherein the piezoelectric ceramic layer is formed by a piezoelectric ceramic according to claim 2.

11. A piezoelectric ceramic component having multiple first electrodes and multiple second electrodes layered alternately on a substrate with piezoelectric ceramic layers, as well as a first terminal electrode that electrically connects to the first electrodes and a second terminal electrode that electrically connects to the second electrodes, wherein the piezoelectric ceramic layer is formed by a piezoelectric ceramic according to claim 2.

12. A piezoelectric device comprising a piezoelectric ceramic component according to claim 4.

13. A piezoelectric device comprising a piezoelectric ceramic component according to claim 5.

14. A piezoelectric device comprising a piezoelectric ceramic component according to claim 6.

15. A piezoelectric ceramic constituted by an alkali-containing niobate perovskite structure having Li, Na, K, Nb and O as constituent elements in the absence of Pb, Sb, Ta, B, and C, wherein a crystal phase expressed by a composition formula Li$_3$NbO$_4$ is deposited in the structure such that the piezoelectric ceramic shows peaks of Li$_3$NbO$_4$ crystal phase in an X-ray diffraction profile and is expressed by a composition formula $\{Li_x[Na_yK_{1-y}]_{1-x}\}_a$ NbO$_3$ (in the formula, $0<x\leq0.20$, $0\leq y\leq1$, and $1.0\leq a\leq1.01$).

16. A piezoelectric ceramic according to claim 15, wherein the alkali-containing niobate perovskite structure is formed from materials having the stoichiometric ratio of Li, Na, K, and Nb, and a surplus amount of Li$_2$CO$_3$ relative to the stoichiometric ratio.

17. A piezoelectric ceramic according to claim 16, further contains Ag by 0.1 mol or more and 0.5 mol or less in equivalent Ag$_2$O relative to 100 mol of the piezoelectric ceramic.

* * * * *